US006326825B1

(12) United States Patent
Walley

(10) Patent No.: US 6,326,825 B1
(45) Date of Patent: Dec. 4, 2001

(54) ACCURATE TIME DELAY SYSTEM AND METHOD UTILIZING AN INACCURATE OSCILLATOR

(75) Inventor: Thomas M Walley, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/765,188

(22) Filed: Jan. 18, 2001

(51) Int. Cl.[7] .................................................. H03L 7/00
(52) U.S. Cl. ............................................. 327/160; 327/273
(58) Field of Search ........................... 327/48, 141, 142, 327/144, 145, 151, 152, 160, 161, 339, 265, 273, 279; 377/107

(56) References Cited

U.S. PATENT DOCUMENTS 4,795,984 * 1/1989 Janssen .................................... 377/26
5,815,043 * 9/1998 Chow et al. ............................ 331/57
5,969,631 * 10/1999 Ammler et al. ................. 340/825.21

* cited by examiner

Primary Examiner—My-Trang Nu Ton
(74) Attorney, Agent, or Firm—Kyle J. Way

(57) ABSTRACT

A time delay system and method utilize an accurate clock signal with a known frequency to calibrate an inaccurate clock signal that will be used to generate a desired time delay. In the case that the frequency of the inaccurate clock signal is lower than the frequency of the accurate clock signal, the number of cycles of the accurate clock signal that occur during a predetermined portion of the inaccurate clock signal is used to calibrate the inaccurate clock signal. Alternately, if the frequency of the inaccurate clock signal is higher than the frequency of the accurate clock signal, the number of cycles of the inaccurate clock signal that occur during a predetermined portion of the accurate clock signal is used in the calibration. The calibrated inaccurate clock signal is then utilized to generate an accurate time delay.

38 Claims, 9 Drawing Sheets

ACCURATE TIME DELAY SYSTEM AND METHOD UTILIZING AN INACCURATE OSCILLATOR

BACKGROUND OF THE INVENTION

A primary concern among users of modern electronic devices is power consumption. For example, the length of time that a user may operate a particular portable electronic product before recharging the associated battery is generally a major purchase consideration for most consumers. Consequently, a major goal of most electronics designers is to reduce the power consumption of their product designs.

Toward this end, many electronic component manufacturers provide integrated circuits (ICs) with a "low-power" mode in addition to their normal "high-power" state. (Other designations for lower power states exist, such as "standby" or "sleep" mode. Additionally, many ICs implement several different low-power levels, each with its own level of functionality and power consumption.) The electronics designers incorporate these ICs into their product designs, utilizing the low-power mode of the ICs prudently so that the products consume the least amount of power possible while still providing the functionality and performance that the user expects.

In general, placing an IC into a low-power state results in the primary functionality of the IC being disabled. During low-power mode, many circuits internal to the IC, including high-frequency clock signals and input/output (I/O) drivers, are essentially turned off, thereby dissipating very little electrical power. Once it is determined that the IC needs to perform a function that requires low-power mode to be terminated, a "wake up" signal is used to end low-power mode, thus bringing the circuit to a fully functional, high-power state.

One common example of a wake-up signal is the output of a time delay circuit that is triggered at the time a portion of the IC is placed in low-power mode. After a desired length of time that a portion of the IC has been in low-power mode, the time delay circuit generates a wake-up signal that returns the low-power portion of the IC to its normal high-power state. A time delay circuit is typically used in this role when a portion of IC circuitry in low-power state must be awakened periodically to perform a specific function before returning to low-power mode. Often, such a time delay circuit is implemented, as shown in FIG. 1, by a precision resistor $R_1$ in series with a precision capacitor $C_1$, configured as a low-pass filter. External precision components are normally used since the accuracy of the time delay circuit is somewhat important for many electronics applications. The time constant of this circuit, along with the threshold voltage of the IC input acting as the wake-up signal input, determines the time delay (the delay between voltage $V_{start}$ going high and voltage $V_{delay}$ going high) until the low-power portion of the IC is awakened. Unfortunately, such a solution requires relatively expensive external components, valuable space on the associated circuit board to house the components, and an IC package pin dedicated to the wake-up signal.

To eliminate the need for an extra IC package pin, expensive external components, and additional circuit board space for the wake-up function, the circuit that generates the wake-up signal could be implemented on the low-power-capable IC. For example, an internal timer circuit driven by a highly accurate onboard crystal or resonator oscillator that generates a stable accurate clock signal may be used for such a purpose. However, such an accurate oscillator generally consumes a few tens to several hundreds of milliamps of current, thus making the accurate oscillator a high-power circuit that should be turned off in low-power mode. Additionally, the superb accuracy of such oscillators is simply not necessary when applied to a wake-up time delay circuit. Other types of oscillator circuits, such as ring oscillators or relaxation oscillators, may be utilized to drive the time delay circuit. Unfortunately, such low-power oscillators are rather unstable and inaccurate, their operating frequency varying by as much as a factor of two- or three-to-one over changes in IC process, supply voltage, and operating temperature. For the majority of IC applications, such frequency variations of inaccurate oscillators are not acceptable for a wake-up time delay circuit.

Therefore, it would be advantageous to implement a time delay circuit utilizing an inaccurate oscillator that generates an accurate time delay signal.

SUMMARY OF THE INVENTION

Specific embodiments according to the present invention, to be described herein, provide a useful way for an inaccurate oscillator to be utilized as part of an accurate time delay circuit. An accurate clock signal, possibly generated by a high-frequency oscillator, serves to calibrate the inaccurate oscillator prior to the initiation of a desired time delay, during which the accurate clock signal will be unavailable. When the desired time delay is to commence, the calibration information previously gathered is utilized to generate an accurate delay using the inaccurate oscillator.

In one embodiment of the invention, a time delay system uses an accurate high-frequency clock signal as an input signal. The time delay circuit has an inaccurate oscillator that generates an inaccurate clock signal with a frequency that is lower than the frequency for the accurate clock signal. A first clock counter circuit counts the number of cycles of the accurate clock signal that occur during a known portion of the inaccurate clock signal. A digital processing unit takes the number of cycles counted by the first clock counter circuit, along with the number of periods in the predetermined portion of the inaccurate clock signal, the period of the accurate clock signal, and a desired time delay, to calculate a desired number of inaccurate clock signal cycles representing the desired time delay. An second clock counter circuit then counts inaccurate clock signal cycles until the desired number is reached, at which point the second clock counter circuit generates a signal indicating that the desired time delay has elapsed.

A second embodiment of the invention involves the use of an inaccurate oscillator that generates an inaccurate clock signal with a frequency that is higher than the frequency of an accurate clock signal. Given these conditions, the first clock counter circuit counts the number of cycles of the inaccurate clock signal that occur during a known portion of the accurate clock signal. A digital processing unit then takes the number of cycles counted by the first clock counter circuit, along with the number of periods in the predetermined portion of the accurate oscillator signal, the period of the accurate clock signal, and a desired time delay, to calculate a desired number of inaccurate clock signal cycles representing the desired time delay. As in the previous embodiment, a second clock counter circuit then counts inaccurate clock signal cycles until the desired number is reached, at which point a signal indicating that the desired time delay has elapsed is generated.

In another embodiment, a method of implementing a time delay begins with counting a number of cycles of an accurate clock signal that occur during a predetermined portion of an inaccurate clock signal, assuming the inaccurate clock signal has a frequency that is lower than the frequency of the accurate clock signal. A desired number of cycles of the accurate clock signal corresponding to a desired time delay is then calculated using the number of cycles from the counting step, the number of periods in the predetermined portion of the inaccurate oscillator signal, and the period of the accurate clock signal. The desired number of cycles of the inaccurate oscillator signal are then counted, and the fact that the desired time delay has elapsed is indicated.

Another method embodiment is employed when the frequency of the inaccurate clock signal is higher than that of the accurate clock signal. First, the number of cycles of the inaccurate clock signal that occur during a predetermined portion of the inaccurate clock signal are counted. A desired number of cycles of the accurate clock signal corresponding to a desired time delay is then calculated using the number of cycles from the counting step, the number of periods in the predetermined portion of the accurate oscillator signal, and the period of the accurate clock signal. Then, as in the previous method embodiment, the desired number of cycles of the inaccurate oscillator signal are counted, after which an indication is made that desired time delay has elapsed.

Other aspects and advantages of the invention will become apparent from the following detailed description, taken in conjunction with the accompanying drawings, illustrating by way of example the principles of the invention.

DETAILED DESCRIPTION

Figure 1:
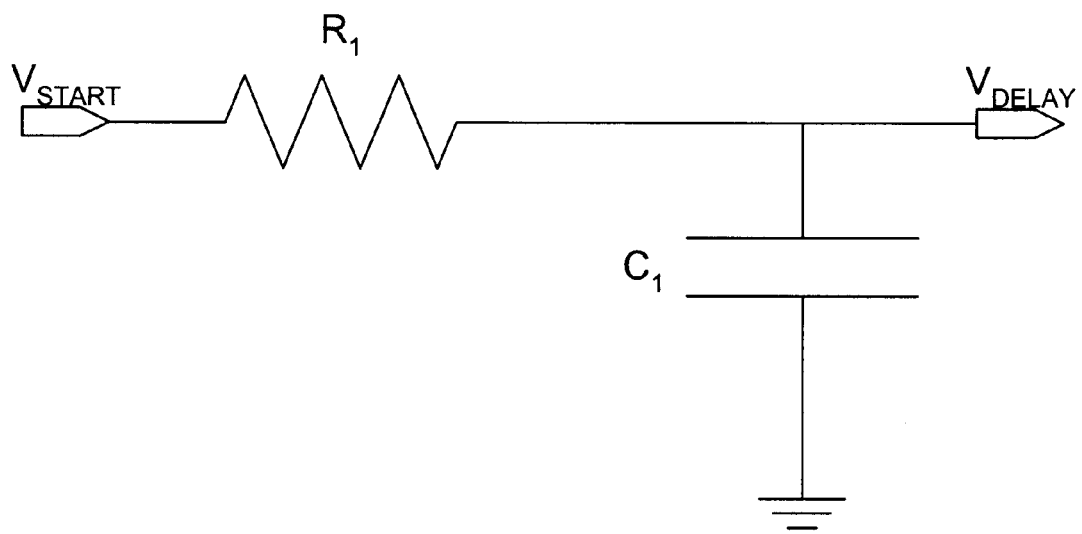
FIG. 1 is an example of a time delay circuit from the prior art.
Figure 2:
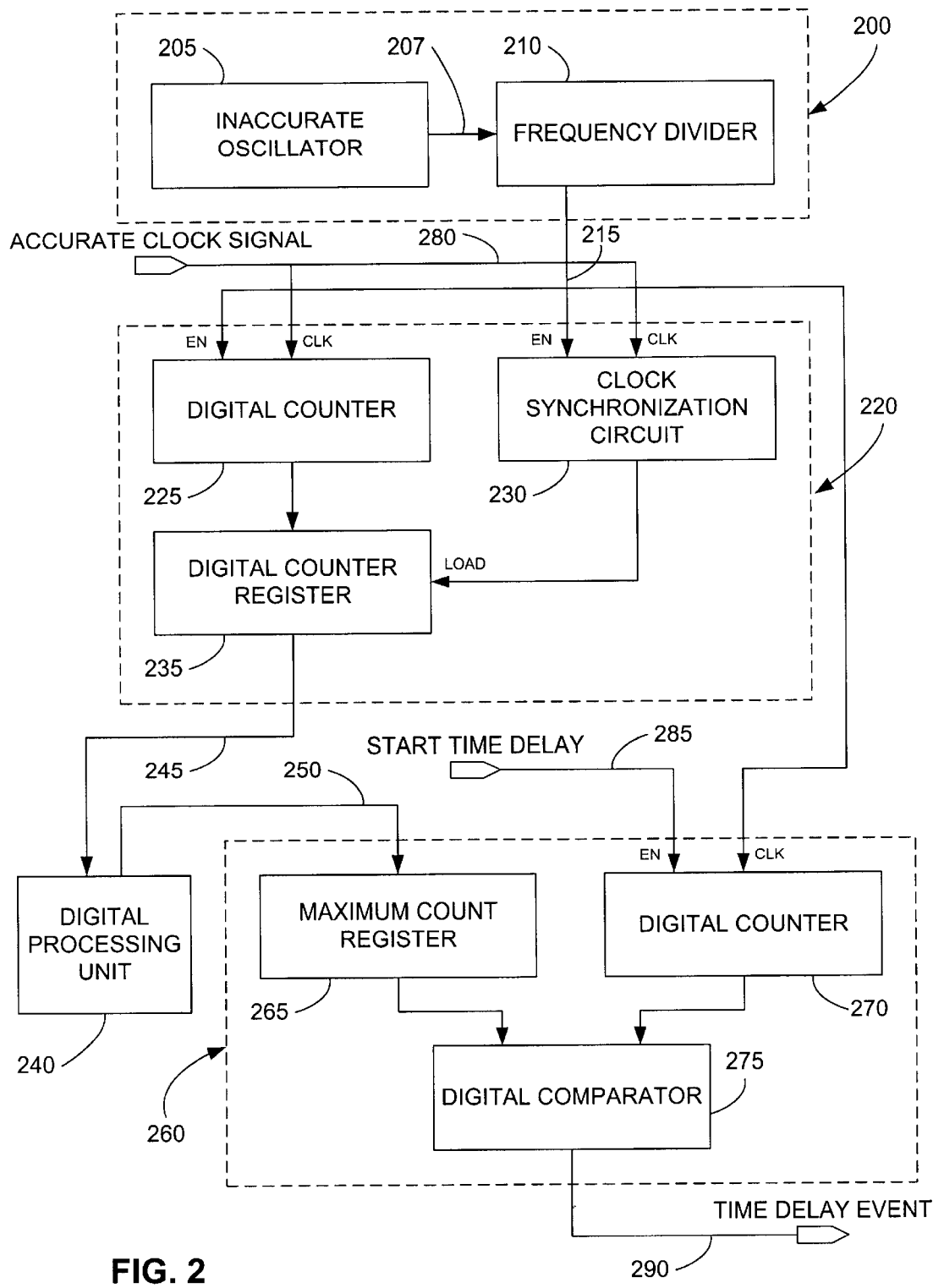
FIG. 2 is a block diagram of a time delay circuit according to an embodiment of the invention wherein the frequency of the inaccurate clock signal is lower than the frequency of the accurate clock signal.

A block diagram of a time delay system according to an embodiment of the invention is shown in FIG. 2. At the input/output interface of the system, an accurate clock signal 280 is used as a calibration input signal. Accurate clock signal 280 can be generated, for example, by a crystal or resonator oscillator circuit (not shown). Also, a start time delay signal 285 is used to initiate the time delay to be measured by the system. Finally, to indicate that the desired time delay has occurred, the system generates a time delay event signal 290.

The system includes an inaccurate clock circuit 200 that generates an inaccurate clock signal 215. In this embodiment, inaccurate clock circuit 200 has an inaccurate oscillator 205 that generates an inaccurate oscillator signal 207. Inaccurate oscillator 205 may be, but is not limited to, a ring oscillator or relaxation oscillator, each of which is well known in the art. Such oscillators typically consume much less power, and are less accurate, in comparison with crystal- or resonator-based oscillator circuits. For this embodiment, the frequency of inaccurate oscillator signal 207 must be less than the frequency of accurate clock signal 280. Typically, but not necessarily, the frequency of inaccurate oscillator signal 207 is about 0.1% to 10.0% of the frequency of accurate clock signal 280. Frequency divider 210 then divides the frequency of inaccurate oscillator signal 207 to generate inaccurate clock signal 215. Typically, frequency divider 210 would divide the frequency of the oscillator by 2, although other integer divisors may also be used. One reason for using frequency divider 210 would be to ensure that inaccurate clock signal 215 exhibits a 50% duty cycle. The signals generated by many inaccurate oscillators, some of which may be used for inaccurate oscillator 205, do not have a 50% duty cycle, which may affect the results of the calibration process, described below. Second, dividing inaccurate oscillator signal 207 by some small divisor would allow more cycles of accurate clock signal 280 to occur during a period of inaccurate clock signal 215, thereby allowing a more accurate calibration of inaccurate clock signal 215. However, in some embodiments, if neither of these problems are a concern to the circuit designer, frequency divider 210 can be removed, with inaccurate oscillator 205 generating is inaccurate clock signal 215 directly.

Figure 4:
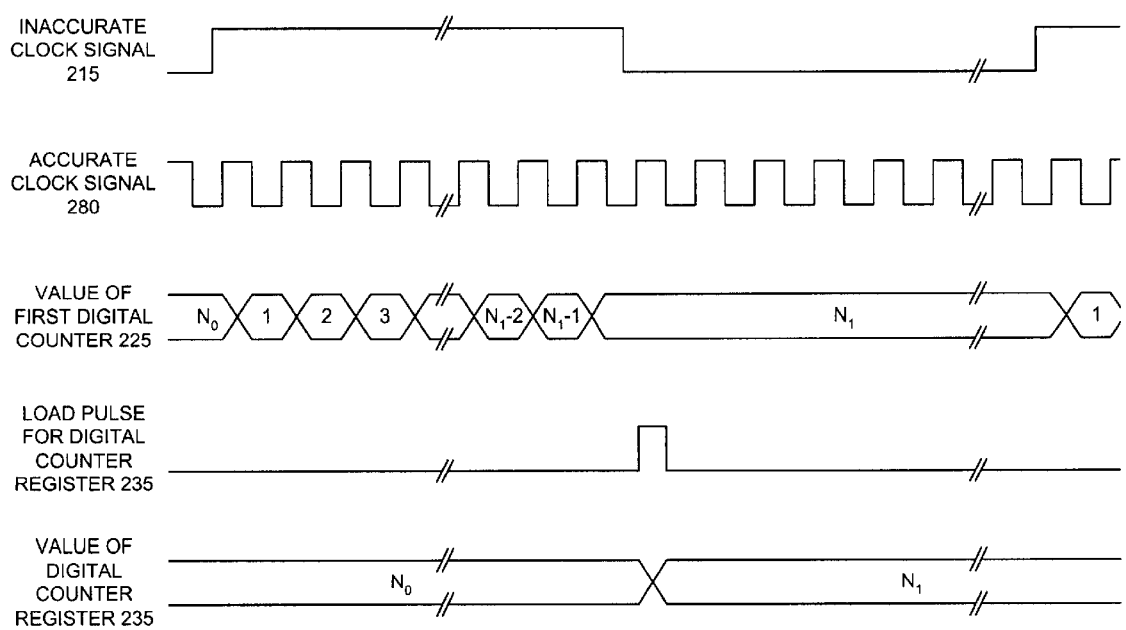
FIG. 4 is an example waveform diagram showing the relationship among an accurate clock signal, an inaccurate oscillator signal, and a real-time count value and a saved count value relating the two signals according to the embodiments of FIG. 3 and FIG. 4.

Accurate clock signal 280 and inaccurate clock signal 215 are then used as input signals for a first clock counter circuit 220, which counts the number of cycles of accurate clock signal 280 that occur during a predetermined portion of inaccurate clock signal 215. In the embodiment of FIG. 2, a first digital counter 225 counts the number of cycles of accurate clock signal 280 each time inaccurate clock signal 215, acting as an enable input for first digital counter 225, is high, representing one-half of one period, as shown in FIG. 4. In other embodiments, other portions of inaccurate clock signal 215, such as an entire period, may be used to enable first digital counter 225. Each time a count of the number of cycles of accurate clock signal 280 that occur while first digital counter 225 is enabled, that count is stored in a digital counter register 235 for use as a calibration value. Digital counter register 235 is loaded by way of a signal generated by a clock synchronization circuit 230, which is a standard type of circuit used in integrated circuits, and is well known in the art. In this particular embodiment, clock synchronization circuit 230 uses accurate clock signal 280 and inaccurate clock signal 215 to generate a load pulse after first digital counter 225 has been disabled so that the count value in first digital counter 225 is stable while it is being loaded into digital Counter register 235, which is also shown in FIG. 4.

Other forms of clock synchronization circuit 230 are also possible. For example, the load pulse could be generated at any time during which the count value of first digital counter 225 is stable.

Digital processing unit 240 takes, as input, the output of digital counter register 235 to perform the calculation necessary to determine the number of cycles of inaccurate clock signal 215 that make up a desired time delay. In this case, the number of inaccurate clock signal cycles desired is $$N_{inacc} = (N_{inaccen} \times T_{delay})/(N_{accen} \times P_{acc}),$$

where $N_{inacc}$ is the number of cycles of inaccurate clock signal 215 representing the desired time delay, $N_{inaccen}$ is the number of cycles of inaccurate clock signal 215 that are used to enable first digital counter 225, $T_{delay}$ is the desired time delay (in seconds), $N_{accen}$ is the number of cycles of accurate clock signal 280 from digital counter register 235, and $P_{acc}$ is the period of the accurate clock signal 280 (in seconds). In the embodiment of FIG. 2, $N_{inaccen}$ is 0.5, since first digital counter 225 is enabled for one-half of a cycle of inaccurate clock signal 215. Additionally, $N_{accen}$ may be a recent value read from digital counter register 235, or could be the result of some averaging algorithm utilizing several values acquired from digital counter register 235. Digital processing unit 240 then passes the number of cycles of inaccurate clock signal 215 representing the desired time delay to a second counter circuit 260 that actually generates the time delay.

Digital processing unit 240 may take several different forms, including, but not limited to, a microprocessor or digital signal processor IC with associated firmware for performing the required calculation, or a special purpose IC that performs the calculation in hardware. Such solutions may access first clock counter circuit 220 or second clock counter circuit 260 by either dedicated signal lines or general purpose data buses.

Second clock counter circuit 260 counts the number of cycles of inaccurate clock signal 215 representing the desired time delay, whose value is stored by digital processing unit 240 in a maximum count register 265. Start time delay signal 285 initiates or enables the counting in second digital counter 270, which uses inaccurate clock signal 215 as a clock source. A digital comparator 275 compares the values of maximum count register 265 with that of second digital counter 270 to determine when the desired time period has elapsed. When the value of second digital counter 270 equals or surpasses the value of maximum count register 265, digital comparator 275 generates time delay event signal 290, indicating that the desired time delay has elapsed.

Figure 3:
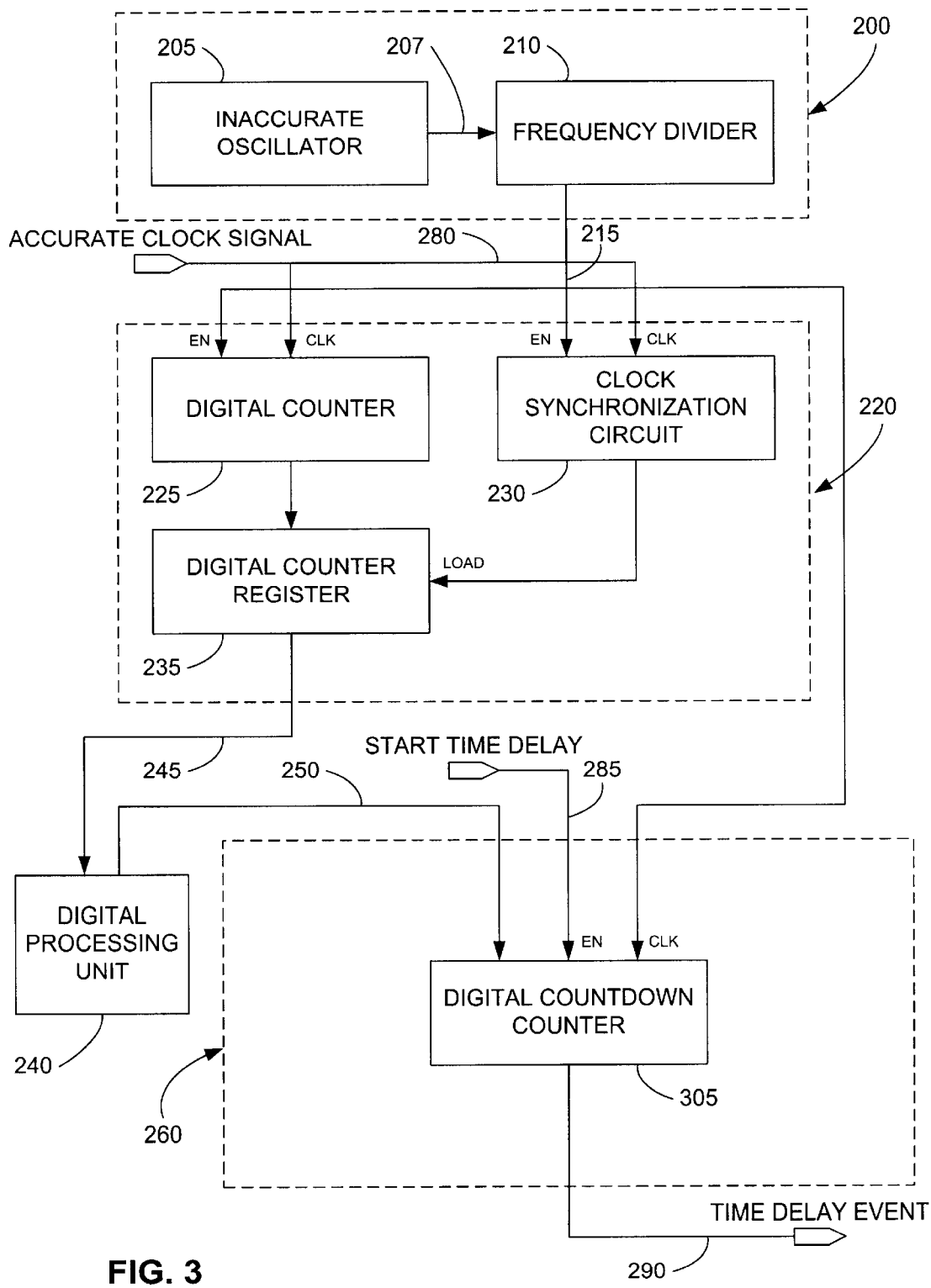
FIG. 3 is a block diagram of a time delay circuit according to another embodiment of the invention wherein the frequency of the inaccurate clock signal is lower than the frequency of the accurate clock signal.

Alternately, as shown in FIG. 3, second counter circuit 260 may be implemented by the use of a digital countdown counter 305. Digital processing unit 240 sets the initial value of digital countdown counter 305 with the number of cycles of inaccurate clock signal 215 representing the desired time delay. When start time delay signal 285 becomes active, digital countdown counter 305 begins counting cycles of inaccurate clock signal 215. When the value of digital countdown counter 305 reaches zero, it generates time delay event signal 290 to indicate that the desired time delay has elapsed.

Figure 5:
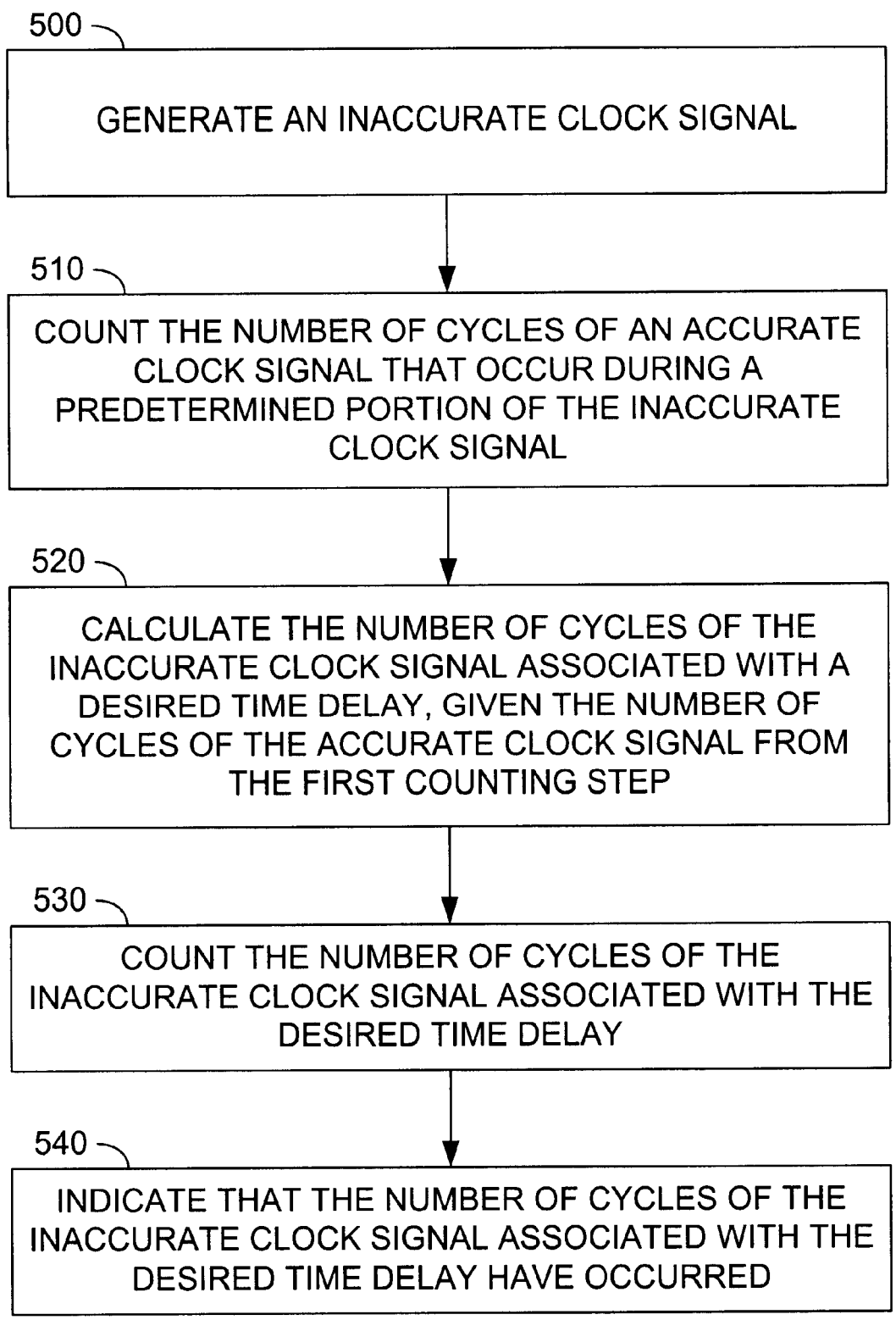
FIG. 5 is a flowchart of a method according to an embodiment of the invention wherein the frequency of the inaccurate clock signal is lower than the frequency of the accurate clock signal.

Another embodiment of the invention takes the form of a method of measuring a desired time delay, presented as a flow chart in FIG. 5. First, an inaccurate clock signal is generated (step 500). In this case, the frequency of the inaccurate clock signal is lower than the frequency of an accurate clock signal used for calibration. The number of cycles of the accurate clock signal that occur during a predetermined portion of the inaccurate clock signal is then counted (step 510). A number of cycles of the inaccurate clock signal representing a desired time delay is then calculated using, the number of cycles of the inaccurate clock signal from the first counting step, the period of the accurate clock signal, the number of periods of the inaccurate clock signal in the predetermined portion from the first counting step, and the length of the desired time delay (step 520). The number of cycles of the inaccurate clock signal from the calculating step is then counted (step 530). Once the second counting step is completed, that fact is then indicated (step 540), thereby signifying that the desired time delay has elapsed.

Other embodiments of the invention exist in which the frequency of the inaccurate clock signal is actually higher than that of the accurate clock signal being employed. In such cases, the frequency of the inaccurate clock signal is typically, but not necessarily, 10 to 1000 times the frequency of the accurate clock signal. For example, in the embodiments of FIG. 6 and FIG. 7, the number of cycles of inaccurate clock signal 215 are counted during a predetermined portion of accurate clock signal 280 using first digital counter 225. Also, clock synchronization circuit 230 uses inaccurate clock signal 215, conditioned by accurate clock signal 280, to generate a load pulse for digital counter register 235 once per cycle of accurate clock signal 280 that is synchronized with the waveform of inaccurate clock signal 215. Analogous to the waveforms of FIG. 4, the graphs of FIG. 8 display an example of the signals involved with first clock counter circuit 220 in relation to the embodiments of FIG. 6 and FIG. 7.

Figure 6:
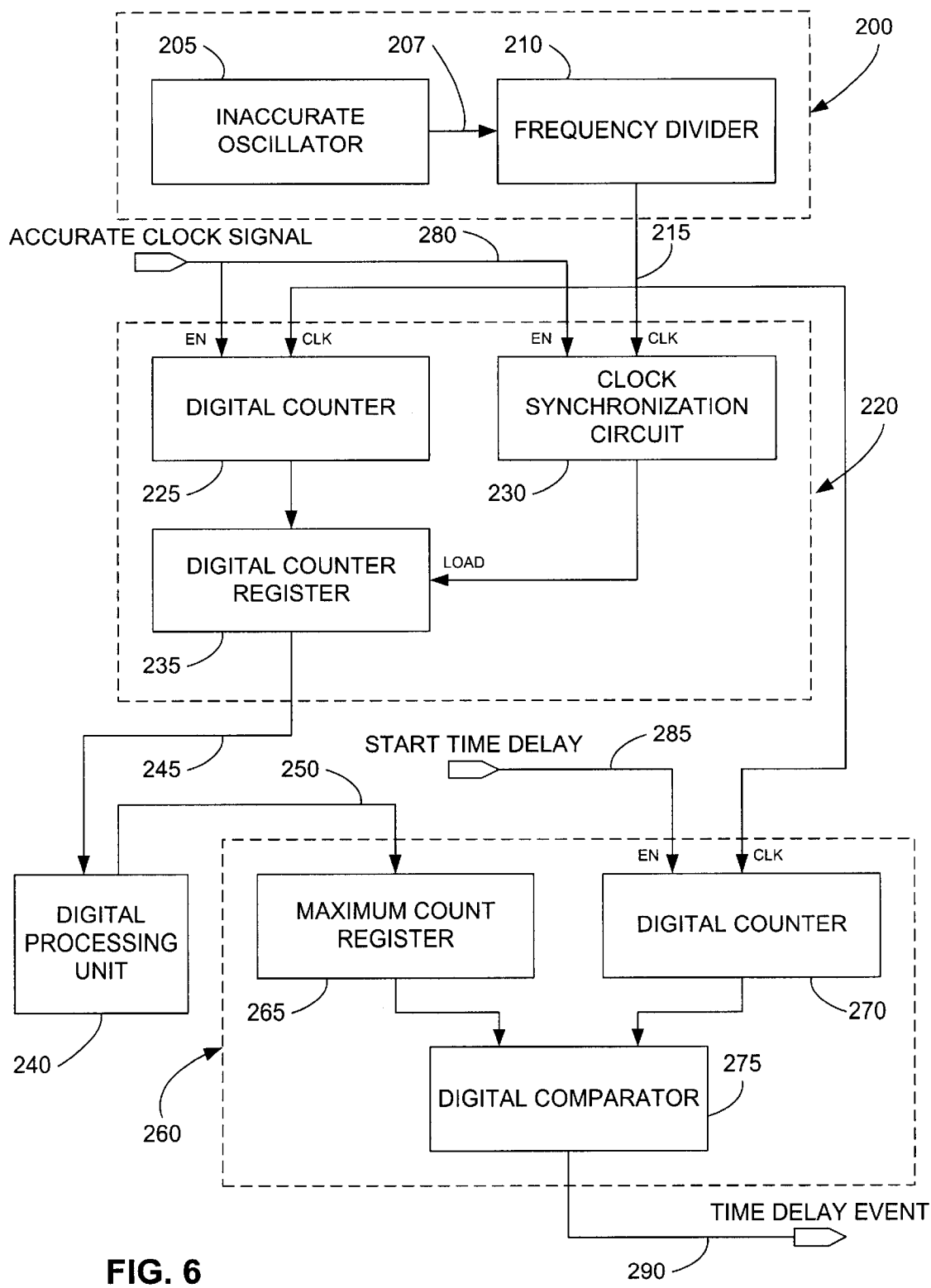
FIG. 6 is a block diagram of a time delay circuit according to an embodiment of the invention wherein the frequency of the inaccurate clock signal is higher than the frequency of the accurate clock signal.
Figure 7:
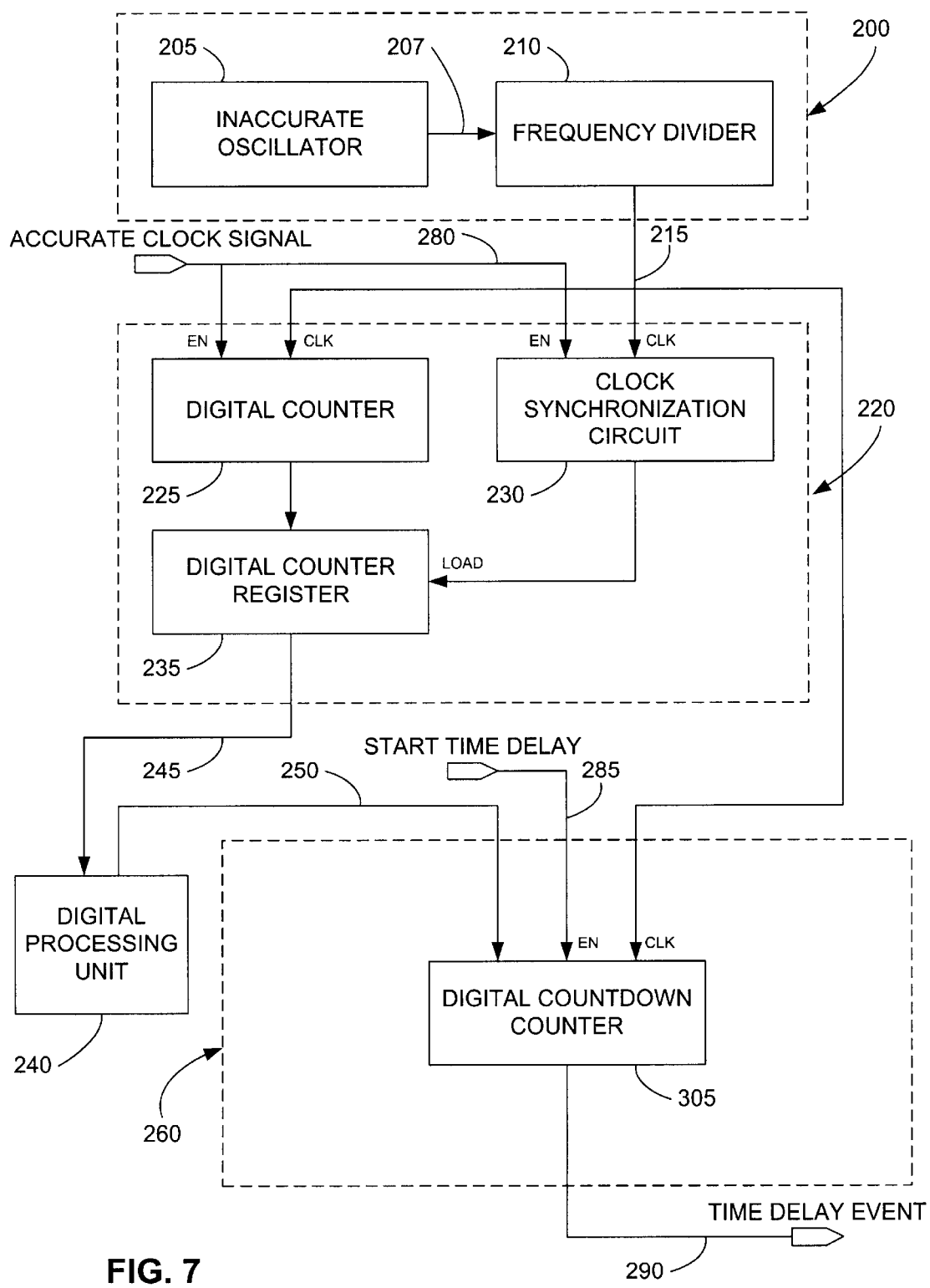
FIG. 7 is a block diagram of a time delay circuit according to another embodiment of the invention wherein the frequency of the inaccurate clock signal is higher than the frequency of the accurate clock signal.

The calculations made by digital processing unit 240 in conjunction with the embodiments of FIG. 6 and FIG. 7 utilize the same formula used with the embodiments of FIGS. 2 and 3:

$$N_{inacc} = (N_{inaccen} \times T_{delay})/(N_{accen} \times P_{acc}).$$

When the frequency of inaccurate clock signal 215 is higher than the frequency of accurate clock signal 280, $N_{inaccen}$ becomes the number of cycles of inaccurate clock signal 215 from digital counter register 235, and $N_{accen}$ becomes the number of cycles of accurate clock signal 280 that are used to enable first digital counter 225. All other portions of the formula remain the same as discussed above.

Figure 8:
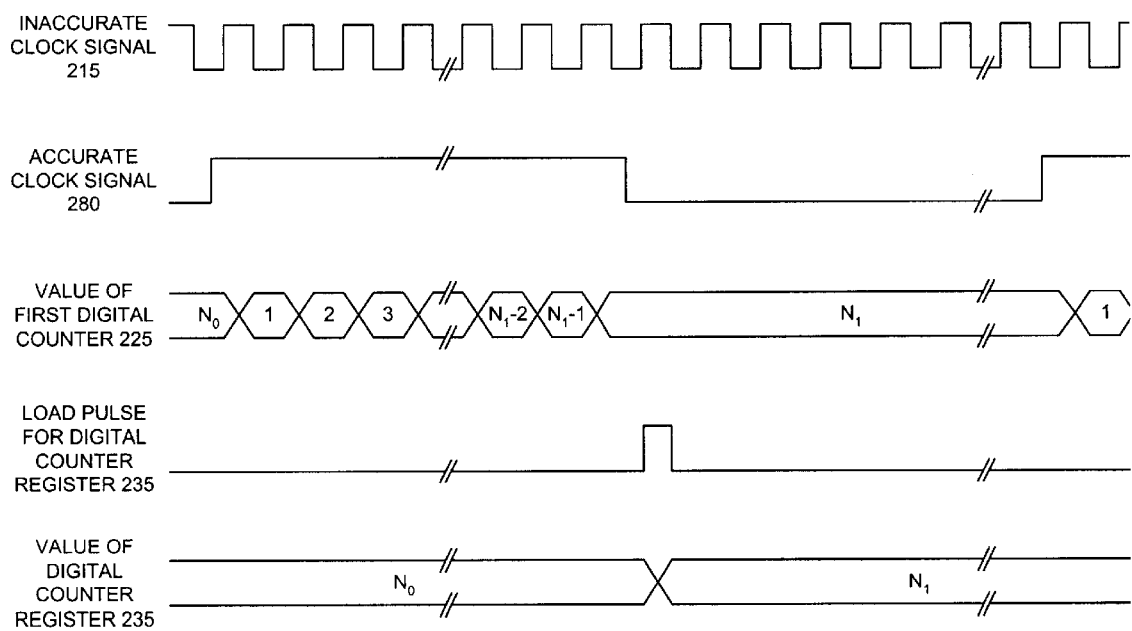
FIG. 8 is an example waveform diagram showing the relationship among an accurate clock signal, an inaccurate oscillator signal, and a real-time count value and a saved count value relating the two signals according to the embodiments of FIG. 6 and FIG. 7.

Once digital processing unit 240 calculates the number of cycles of inaccurate clock signal 215 that represent a desired time delay, second clock counter circuit 260 of FIG. 7 and FIG. 8 is utilized in the same manner as the corresponding portions of FIG. 2 and FIG. 3.

Figure 9:
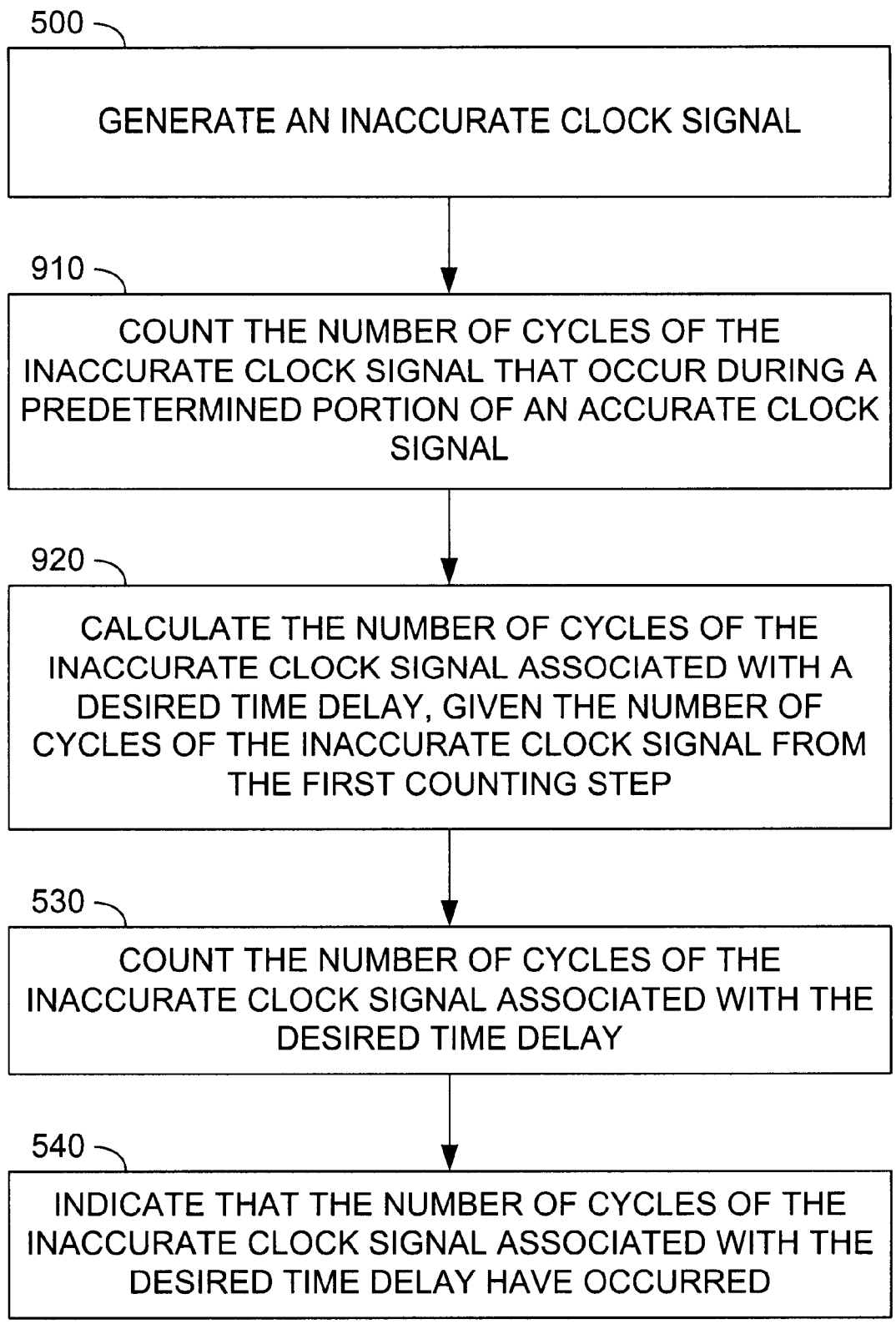
FIG. 9 is a flowchart of a method according to an embodiment of the invention wherein the frequency of the inaccurate clock signal is higher than the frequency of the accurate clock signal.

Additionally, a method embodiment for generating a time delay when the frequency of the inaccurate clock signal is higher than the frequency of the accurate clock signal is shown in the flow chart of FIG. 9. First, an inaccurate clock signal is (generated (step 500), as also shown in FIG. 5. The number of cycles of the inaccurate clock signal that occur during a predetermined portion of the accurate clock signal is then counted (step 910). A number of cycles of the inaccurate clock signal representing a desired time delay is then calculated using the number of cycles of the accurate clock signal from the first counting step, the period of the accurate clock signal, the number of periods of the inaccurate clock signal in the predetermined portion from the first counting step, and the length of the desired time delay (step 920). The number of cycles of the inaccurate clock signal from the calculating step are then counted (step 530), as in the embodiment of FIG. 5. Once the second counting step is completed, the fact that the desired time delay has elapsed in indicated (step 540).

What is claimed is:

1. A time delay system using an accurate clock signal for calibration, the time delay system comprising:

means for generating an inaccurate clock signal, the frequency of the inaccurate clock signal being lower than the frequency of the accurate clock signal;

first means for counting a number of cycles of the accurate clock signal that occur during a predetermined portion of the inaccurate clock signal;

means for calculating a desired number of cycles of the inaccurate clock signal representing a desired time delay using the number of cycles of the accurate clock signal from the first counting means, the number of periods in the predetermined portion of the inaccurate clock signal, the period of the accurate clock signal, and the desired time delay;

second means for counting the desired number of cycles of the inaccurate clock signal; and means for indicating that the desired number of cycles of the inaccurate clock signal have occurred, whereby the desired time delay has elapsed.

2. The time delay system of claim 1, wherein the frequency of the inaccurate clock signal is 0.1% to 10.0% of the frequency of the accurate clock signal.

3. The time delay system of claim 1, wherein the predetermined portion of the inaccurate clock signal is one-half of a complete period.

4. A time delay system using an accurate clock signal for calibration, the time delay system comprising:

an inaccurate clock circuit that generates an inaccurate clock signal, the frequency of the inaccurate clock signal being lower than the frequency of the accurate clock signal;

a first clock counter circuit that counts a number of cycles of the accurate clock signal that occur during a predetermined portion of the inaccurate clock signal;

a digital processing unit that calculates a desired number of cycles of the inaccurate clock signal representing a desired time delay using the number of cycles of the accurate clock signal from the first clock counter circuit, the number of periods in the predetermined portion of the inaccurate clock signal, the period of the accurate clock signal, and the desired time delay; and a second clock counter circuit that counts a number of cycles of the inaccurate clock signal upon receipt of a start time delay signal, the second clock counter circuit generating a time delay event signal when the number of cycles of the inaccurate clock signal reaches the desired number of cycles of the inaccurate clock signal calculated by the digital processing unit, thereby indicating that the desired time delay has elapsed.

5. The time delay system of claim 4, wherein the frequency of the inaccurate clock signal is 0.1% to 10.0% of the frequency of the accurate clock signal.

6. The time delay system of claim 4, wherein the predetermined portion of the inaccurate clock signal is one-half of a complete period.

7. The time delay system of claim 4, wherein the inaccurate clock circuit comprises:

an inaccurate oscillator that generates an inaccurate oscillator signal; and a digital frequency divider that takes as input the inaccurate oscillator signal and generates the inaccurate clock signal.

8. The time delay system of claim 4, wherein the first clock counter circuit comprises:

a first digital counter being clocked by the accurate clock signal, the first digital counter being enabled by the predetermined portion of the inaccurate clock signal, the first digital counter generating a count value indicating the number of cycles of the accurate clock signal that occurred during the predetermined portion of the inaccurate clock signal;

a clock synchronization circuit being clocked by the accurate clock signal, the clock synchronization circuit being enabled by the inaccurate clock signal, the clock synchronization circuit issuing a load pulse once per period of the inaccurate clock signal that is synchronized with the accurate clock signal, the load pulse being issued while the first digital counter is disabled; and a digital counter register being loaded with the count value of the first digital counter by the load pulse issued by the clock synchronization circuit, the digital counter register generating a synchronized count output, readable by the digital processing unit, thereby indicating the number of cycles of the accurate clock signal that occurred during the predetermined portion of the inaccurate clock signal.

9. The time delay system of claim 4, wherein the second clock counter circuit comprises:

a maximum count register being loaded with the desired number of cycles of the inaccurate clock signal calculated by the digital processing unit;

a second digital counter being clocked by the inaccurate clock signal, the second digital counter being started by the start time delay signal, the second digital counter generating a count value; and a digital comparator that compares the desired number of cycles of the inaccurate clock signal from the maximum count register with the count value generated by the second digital counter, the digital comparator generating the time delay event signal when the desired number of cycles of the inaccurate clock signal from the maximum count register equals or surpasses the count value generated by the second digital counter.

10. The time delay system of claim 4, wherein the second clock counter circuit comprises:

a digital countdown counter being loaded with the desired number of cycles of the inaccurate clock signal calculated by the digital processing unit, the digital countdown counter being clocked by the inaccurate clock signal, the digital countdown counter being started by the start time delay signal, the digital countdown counter generating the time delay event signal when the count value reaches zero.

11. A time delay system using an accurate clock signal for calibration, the time delay system comprising:

an inaccurate oscillator generating an inaccurate oscillator signal, the frequency of the inaccurate oscillator signal being lower than the frequency of the accurate clock signal;

a digital frequency divider that takes as input the inaccurate oscillator signal, and generates an inaccurate clock signal;

a first digital counter having a clock input driven by the accurate clock signal, the first digital counter having an enable input driven by a predetermined portion of the inaccurate clock signal, the first digital counter having a count output;

a clock synchronization circuit having a clock input driven by the accurate clock signal, the clock synchronization circuit having an enable input driven by the inaccurate clock signal, the clock synchronization circuit issuing a load pulse once per period of the inaccurate clock signal that is synchronized with the accurate clock signal, the load pulse being issued while the first digital counter is disabled;

a digital counter register having an input driven by the count output of the first digital counter, the digital counter register having a load input driven by the load pulse of the clock synchronization circuit, the digital counter register having a synchronized count output;

a digital processing unit that takes the synchronized count output of the digital counter register, along with the number of periods in the predetermined portion of the inaccurate clock signal, the period of the accurate clock signal, and a desired time delay, and calculates a desired number of cycles of the inaccurate clock signal representing the desired time delay;

a maximum count register storing the desired number of cycles of the inaccurate clock signal from the digital processing unit;

a second digital counter having a clock input driven by the inaccurate clock signal, the second digital counter being started by a start time delay signal, the second digital counter having a count output; and a digital comparator having a first input driven by the desired number of cycles of the inaccurate clock signal stored in the maximum count register, the digital comparator having a second input driven by the count output of the second digital counter, the digital comparator generating a time delay event signal when the desired number of cycles of the inaccurate clock signal from the maximum count register equals or surpasses the count value generated by the second digital counter, thereby indicating that the desired time delay has elapsed.

12. The time delay system of claim 11, wherein the frequency of the inaccurate clock signal is 0.1% to 10.0% of the frequency of the accurate clock signal.

13. The time delay system of claim 11, wherein the predetermined portion of the inaccurate clock signal is one-half of a complete period.

14. A time delay system using an accurate clock signal for calibration, the time delay system comprising:

an inaccurate oscillator generating an inaccurate oscillator signal, the frequency of the inaccurate oscillator signal being lower than the frequency of the accurate clock signal;

a digital frequency divider that takes as input the inaccurate oscillator signal, and generates an inaccurate clock signal;

a first digital counter having a clock input driven by the accurate clock signal, the first digital counter having an enable input driven by a predetermined portion of the inaccurate clock signal, the first digital counter having a count output;

a clock synchronization circuit having a clock input driven by the accurate clock signal, the clock synchronization circuit having an enable input driven by the inaccurate clock signal, the clock synchronization circuit issuing a load pulse once per period of the inaccurate clock signal that is synchronized with the accurate clock signal, the load pulse being issued while the first digital counter is disabled;

a digital counter register having an input driven by the count output of the first digital counter, the digital counter register having a load input driven by the load pulse of the clock synchronization circuit, the digital counter register having a synchronized count output;

a digital processing unit that takes the synchronized count output of the digital counter register, along with the number of periods in the predetermined portion of the inaccurate clock signal, the period of the accurate clock signal, and a desired time delay, and calculates a desired number of cycles of the inaccurate clock signal representing the desired time delay;

a digital countdown counter storing the desired number of cycles of the inaccurate clock signal from the digital processing unit as a stored count value, the digital countdown counter having a clock input driven by the inaccurate clock signal, the digital countdown counter being started by a start time delay signal, the digital countdown counter generating the time delay event signal when the stored count value reaches zero, thereby indicating that the desired time delay has elapsed.

15. The time delay system of claim 14, wherein the frequency of the inaccurate clock signal is 0.1% to 10.0% of the frequency of the accurate clock signal.

16. The time delay system of claim 14, wherein the predetermined portion of the inaccurate clock signal is one-half of a complete period.

17. A time delay system using an accurate clock signal for calibration, the time delay system comprising:

means for generating an inaccurate clock signal, the frequency of the inaccurate clock signal being higher than the frequency of the accurate clock signal;

first means for counting a number of cycles of the inaccurate clock signal that occur during a predetermined portion of the accurate clock signal;

means for calculating a desired number of cycles of the inaccurate clock signal representing a desired time delay using the number of cycles of the inaccurate clock signal from the first counting means, the number of periods in the predetermined portion of the accurate clock signal, the period of the accurate clock signal, and the desired time delay;

second means for counting the desired number of cycles of the inaccurate clock signal; and means for indicating that the desired number of cycles of the inaccurate clock signal have occurred, whereby the desired time delay has elapsed.

18. The time delay system of claim 17, wherein the frequency of the inaccurate clock signal is 10 to 1000 times the frequency of the accurate clock signal.

19. The time delay system of claim 17, wherein the predetermined portion of the accurate clock signal is one-half of a complete period.

20. A time delay system using an accurate clock signal for calibration, the time delay system comprising:

an inaccurate clock circuit that generates an inaccurate clock signal, the frequency of the inaccurate clock signal being higher than the frequency of the accurate clock signal;

a first clock counter circuit that counts a number of cycles of the inaccurate clock signal that occur during a predetermined portion of the accurate clock signal;

a digital processing unit that calculates a desired number of cycles of the inaccurate clock signal representing a desired time delay using the number of cycles of the inaccurate clock signal from the first clock counter circuit, the number of periods in the predetermined portion of the accurate clock signal, the period of the accurate clock signal, and the desired time delay; and a second clock counter circuit that counts a number of cycles of the inaccurate clock signal upon receipt of a start time delay signal, the second clock counter circuit generating a time delay event signal when the number of cycles of the inaccurate clock signal reaches the desired number of cycles of the inaccurate clock signal calculated by the digital processing unit, thereby indicating that the desired time delay has elapsed.

21. The time delay system of claim 20, wherein the frequency of the inaccurate clock signal is 10 to 1000 times the frequency of the accurate clock signal.

22. The time delay system of claim 20, wherein the predetermined portion of the accurate clock signal is one-half of a complete period.

23. The time delay system of claim 20, wherein the inaccurate clock circuit comprises:

an inaccurate oscillator that generates an inaccurate oscillator signal; and a digital frequency divider that takes as input the inaccurate oscillator signal and generates the inaccurate clock signal.

24. The time delay system of claim 20, wherein the first clock counter circuit comprises:

a first digital counter being clocked by the inaccurate clock signal, the first digital counter being enabled by the predetermined portion of the accurate clock signal, the first digital counter generating a count value indicating the number of cycles of the inaccurate clock signal that occurred during the predetermined portion of the accurate clock signal;

a clock synchronization circuit being clocked by the inaccurate clock signal, the clock synchronization circuit being enabled by the accurate clock signal, the clock synchronization circuit issuing a load pulse once per period of the accurate clock signal that is synchronized with the inaccurate clock signal, the load pulse being issued while the first digital counter is disabled; and a digital counter register being loaded with the count value of the first digital counter by the load pulse issued by the clock synchronization circuit, the digital counter register generating a synchronized count output, readable by the digital processing unit, thereby indicating the number of cycles of the inaccurate clock signal that occurred during the predetermined portion of the accurate clock signal.

25. The time delay system of claim 20, wherein the second clock counter circuit comprises:

a maximum count register being loaded with the desired number of cycles of the inaccurate clock signal calculated by the digital processing unit;

a second digital counter being clocked by the inaccurate clock signal, the second digital counter being started by the start time delay signal, the second digital counter generating a count value; and a digital comparator that compares the desired number of cycles of the inaccurate clock signal from the maximum count register with the count value generated by the second digital counter, the digital comparator generating the time delay event signal when the desired number of cycles of the inaccurate clock signal from the maximum count register equals or surpasses the count value generated by the second digital counter.

26. The time delay system of claim 20, wherein the second clock counter circuit comprises:

a digital countdown counter being loaded with the desired number of cycles of the inaccurate clock signal calculated by the digital processing unit, the digital countdown counter being clocked by the inaccurate clock signal, the digital countdown counter being started by the start time delay signal, the digital countdown counter generating the time delay event signal when the count value reaches zero.

27. A time delay system using an accurate clock signal for calibration, the time delay system comprising:

an inaccurate oscillator generating an inaccurate oscillator signal, the frequency of the inaccurate oscillator signal being higher than the frequency of the accurate clock signal;

a digital frequency divider that takes as input the inaccurate oscillator signal, and generates an inaccurate clock signal;

a first digital counter having a clock input driven by the inaccurate clock signal, the first digital counter having an enable input driven by a predetermined portion of the accurate clock signal, the first digital counter having a count output;

a clock synchronization circuit having a clock input driven by the inaccurate clock signal, the clock synchronization circuit having an enable input driven by the accurate clock signal, the clock synchronization circuit issuing a load pulse once per period of the accurate clock signal that is synchronized with the inaccurate clock signal, the load pulse being issued while the first digital counter is disabled;

a digital counter register having an input driven by the count output of the first digital counter, the digital counter register having a load input driven by the load pulse of the clock synchronization circuit, the digital counter register having a synchronized count output;

a digital processing unit that takes the synchronized count output of the digital counter register, along with the number of periods in the predetermined portion of the accurate clock signal, the period of the accurate clock signal, and a desired time delay, and calculates a desired number of cycles of the inaccurate clock signal representing the desired time delay;

a maximum count register storing the desired number of cycles of the inaccurate clock signal from the digital processing unit;

a second digital counter having a clock input driven by the inaccurate clock signal, the second digital counter being started by a start time delay signal, the second digital counter having a count output; and a digital comparator having a first input driven by the desired number of cycles of the inaccurate clock signal stored in the maximum count register, the digital comparator having a second input driven by the count output of the second digital counter, the digital comparator generating a time delay event signal when the desired number of cycles of the inaccurate clock signal from the maximum count register equals or surpasses the count value generated by the second digital counter, thereby indicating that the desired time delay has elapsed.

28. The time delay system of claim 27, wherein the frequency of the inaccurate clock signal is 10 to 1000 times the frequency of the accurate clock signal.

29. The time delay system of claim 27, wherein the predetermined portion of the accurate clock signal is one-half of a complete period.

30. A time delay system using an accurate clock signal for calibration, the time delay system comprising:
  an inaccurate oscillator generating an inaccurate oscillator signal, the frequency of the inaccurate oscillator signal being higher than the frequency of the accurate clock signal;
  a digital frequency divider that takes as input the inaccurate oscillator signal, and generates an inaccurate clock signal;
  a first digital counter having a clock input driven by the inaccurate clock signal, the first digital counter having an enable input driven by a predetermined portion of the accurate clock signal, the first digital counter having a count output;
  a clock synchronization circuit having a clock input driven by the inaccurate clock signal, the clock synchronization circuit having an enable input driven by the accurate clock signal, the clock synchronization circuit issuing a load pulse once per period of the accurate clock signal that is synchronized with the inaccurate clock signal, the load pulse being issued while the first digital counter is disabled;
  a digital counter register having an input driven by the count output of the first digital counter, the digital counter register having a load input driven by the load pulse of the clock synchronization circuit, the digital counter register having a synchronized count output;
  a digital processing unit that takes the synchronized count output of the digital counter register, along with the number of periods in the predetermined portion of the accurate clock signal, the period of the accurate clock signal, and a desired time delay, and calculates a desired number of cycles of the inaccurate clock signal representing the desired time delay;
  a digital countdown counter storing the desired number of cycles of the inaccurate clock signal from the digital processing unit as a stored count value, the digital countdown counter having a clock input driven by the inaccurate clock signal, the digital countdown counter being started by a start time delay signal, the digital countdown counter generating the time delay event signal when the stored count value reaches zero, thereby indicating that the desired time delay has elapsed.

31. The time delay system of claim 30, wherein the frequency of the inaccurate clock signal is 10 to 1000 times the frequency of the accurate clock signal.

32. The time delay system of claim 30, wherein the predetermined portion of the accurate clock signal is one-half of a complete period.

33. A method of generating an accurate time delay using an accurate clock signal for calibration, the method comprising the steps of:
  generating an inaccurate clock signal, the frequency of the inaccurate clock signal being lower than the frequency of the accurate clock signal;
  counting a number of cycles of the accurate clock signal that occur during a predetermined portion of the inaccurate clock signal;
  calculating a desired number of cycles of the inaccurate clock signal representing a desired time delay using the number of cycles of the accurate clock signal from the first counting step, the number of periods in the predetermined portion of the inaccurate clock signal, the period of the accurate clock signal, and the desired time delay;
  counting the desired number of cycles of the inaccurate clock signal; and
  indicating that the desired number of cycles of the inaccurate clock signal have occurred, whereby the desired time delay has elapsed.

34. The method of claim 33, wherein the frequency of the inaccurate clock signal is 0.1% to 10.0% of the frequency of the accurate clock signal.

35. The method of claim 33, wherein the predetermined portion of the inaccurate clock signal is one-half of a complete period.

36. A method of generating an accurate time delay using an accurate clock signal for calibration, the method comprising the steps of:
  generating an inaccurate clock signal, the frequency of the inaccurate clock signal being higher than the frequency of the accurate clock signal;
  counting a number of cycles of the inaccurate clock signal that occur during a predetermined portion of the accurate clock signal;
  calculating a desired number of cycles of the inaccurate clock signal representing a desired time delay using the number of cycles of the inaccurate clock signal from the first counting step, the number of periods in the predetermined portion of the accurate clock signal, the period of the accurate clock signal, and the desired time delay;
  counting the desired number of cycles of the inaccurate clock signal; and
  indicating that the desired number of cycles of the inaccurate clock signal have occurred, whereby the desired time delay has elapsed.

37. The method of claim 36, wherein the frequency of the inaccurate clock signal is 10 to 1000 times the frequency of the accurate clock signal.

38. The method of claim 36, wherein the predetermined portion of the accurate clock signal is one-half of a complete period.

* * * * *